United States Patent [19]

Frens

[11] 4,207,614

[45] Jun. 10, 1980

[54] MAGNETIC BUBBLE SHIFT REGISTER STORE

[75] Inventor: Gerrit Frens, Eindhoven, Netherlands

[73] Assignee: U.S. Philips Corporation, New York, N.Y.

[21] Appl. No.: 917,250

[22] Filed: Jun. 20, 1978

Related U.S. Application Data

[63] Continuation of Ser. No. 765,625, Jan. 25, 1977, abandoned, which is a continuation of Ser. No. 563,069, Mar. 28, 1975, abandoned, which is a continuation of Ser. No. 387,103, Aug. 9, 1973, abandoned.

[30] Foreign Application Priority Data

Sep. 2, 1972 [NL] Netherlands ......................... 7212007

[51] Int. Cl.² ............................................. G11C 19/08
[52] U.S. Cl. ...................................... 365/32; 365/13; 365/14; 365/37
[58] Field of Search ...................... 365/13, 22, 32, 37

[56] References Cited

U.S. PATENT DOCUMENTS

| | | | |
|---|---|---|---|
| 3,636,531 | 1/1972 | Copeland | 365/37 |
| 3,745,542 | 7/1973 | Copeland | 365/37 |
| 3,944,842 | 3/1976 | Dorleijn | 365/32 |

OTHER PUBLICATIONS

IBM Technical Disclosure Bulletin-vol. 13, No. 9, Feb. 1971, 365-22, p. 2738.

*Primary Examiner*—James W. Moffitt
*Attorney, Agent, or Firm*—Thomas A. Briody; Jack Oisher; James J. Cannon, Jr.

[57] ABSTRACT

A magnetic bubble shift register store having a plate of magnetic material whose preferred magnetization direction extends transverse to the plane of the plate and in which bubbles are situated, said plate having two separate, elongated generally parallel extending continuous bubble paths, of lower bubble energy in comparison with the vicinity; the center lines of said paths being situated at a distance from each other which is at least equal to the mean bubble diameter. The 0-bits of written information to be transported and stored are represented by bubbles in the one path, while the 1-bits thereof are represented by bubbles in the other path. The interaction between the bubbles ensures that bubbles in the two paths cannot pass each other, with the result that the information represented by the bubbles can be unambiguously transported and maintained in the path direction.

22 Claims, 11 Drawing Figures

MAGNETIC BUBBLE SHIFT REGISTER STORE

This is a continuation of Ser. No. 765,625, filed Jan. 25, 1977, which was a continuation of Ser. No. 563,069, filed Mar. 28, 1975, which was a continuation of Ser. No. 387,103, filed Aug. 9, 1973, all now abandoned.

BACKGROUND OF THE INVENTION

1. Field of the Invention

The invention relates to a magnetic bubble shift register memory, comprising a plate of magnetic material having a preferred magnetization direction transverse to said plate and in which, under the influence of an external magnetic field, magnetic domains or bubbles having a generally circular section can exist; furthermore, comprising a channel for the transfer and the storage of information by means of said bubbles which are preferably situated in said channel; binary information being distinguishable in the direction of the channel in that binary 1-bit values are represented by bubbles on the one longitudinal side, and binary 0-bit values are represented by bubbles on the other longitudinal side.

DESCRIPTION OF THE PRIOR ART

The channel of this bubble shift register memory in which circular domains, also referred to hereinafter as bubbles, are preferably situated has been proposed as a possibility for storing digital information. In the prior art proposal, the channel consists of a continuous path extending in the longitudinal direction of the channel, having lower bubble energy than the adjacent areas in the vicinity of the path. It is stated that at least two stable bubble positions are present transverse to the path within the limits of the path. In other words, in the transverse direction of the path there are locations where the bubble energy is still lower for a bubble than in the remainder of the path. Utilizing these stable bubble positions in such a path, bubbles representing either binary 1-bits or binary 0-bits can be distinguished. In this proposal the said path is realized on the plate by providing the plate with one or more elongate very thin (thickness <0.1 μm) strips of a soft-magnetic but not permanently magnetizable material. A strip becomes fully magnetized by a part of a bubble. This, in fact, causes the presence of preferred positions on both sides of the strip. In this prior art proposal concerning one path containing a plurality of preferred positions, the bubble energy thresholds present between the various preferred positions for a bubble are comparatively low, as appears also from the calculations underlying the proposal. This renders these preferred positions unsuitable for guiding information through the channel if some requirements are imposed with respect to reliability. The risk is high that impurities in the material or external disturbances can cause the bubbles to change their positions within the path, with the result that an undesired modificatin of the information content is introduced.

The magnetic bubble shift register memory according to the invention utilizes an information channel which does not incorporate this serious drawback of the above prior art. According to the invention, the magnetic bubble memory is characterized in that the channel consists of two separate elongated, generally parallel extending continuous bubble paths which, in comparison with the vicinity of the paths, have lower bubble energy and in which bubbles are preferably situated. The higher bubble energy outside a path prevents a bubble in such a path from leaving the path, the distance between the centre lines of the generally parallel paths being at least equal to the bubble diameter. The interaction between the bubbles in the two paths prevents a bubble situated in the one path from passing a bubble situated in the other path, with the result that the binary information which is contained in the sequency of bubbles in each path can be unambiguously transferred in the channel direction and can be maintained both during transfer and in a rest state. It is to be noted that hereinafter a bubble path, in comparison with the vicinity thereof, having lower bubble energy is to be understood to mean that, if a bubble is situated in a path, the energy of the plate of magnetic material containing the bubble is lower than if the bubble is present in the plate outside said path. Consequently, considering the realization of separate bubble paths having lower bubble energy than the vicinity, it is precluded according to the invention that bubbles can move from one path to the other in the channel and it is thus ensured that an information pattern present in the channel is unambiguously maintained. Utilizing this channel, a magnetic bubble shift register memory is obtained according to the invention in which information not only can be maintained, but also can be transferred. This transferability is not proposed as a possibility in the above known prior art proposal. As a result of said interaction of the bubbles in their respective paths, an information pattern can be transferred as one unit in the direction of the channel, without the contents of the information being liable to change. This is based on the fact that the location in which the information is present in a shift register is not important, but that only the sequence of 1-bits and 0-bits during the storage and the transfer in the register is of importance. The magnetic shift register bubble memory according to the invention thus differs from other shift registers known in the bubble technique.

In the prior art there are always discrete bubble positions where bubbles are present or absent in accordance with the information pattern. Known devices are those in which use is made of special guide structures such as T-bars and so forth. Because the bit value 1 can be assigned to the presence of a bubble on a stable position and the bit value 0 to the absence of such a bubble on such a position, a series of individually displaceable bubbles contains a binary information pattern in such a channel of defined bubble positions. A drawback of these shift registers is that the absence of a bubble (0-value) can readily change into the presence of a bubble (1-value) at the same location in the series and because with a given series nothing counteracts the presence or absence of a bubble on a given stable position. In particular, such disturbances of the information pattern are often caused by the repulsive forces present between bubbles in a plate. This problem will arise particularly if bubbles are present in the vicinity of the channel, for example, in a neighboring information channel. Furthermore, deviations in the material of the plate which are not serious in themselves can create situations in which the uncertainty in the information pattern is increased. If a bubble is blocked on a given position in such circumstances, bubbles before and after said positions can still change their position so that the pattern is disturbed. In the magnetic bubble memory according to the invention this situation cannot occur because there are no fixed positions within the channel. As a result of material defects, the distances between the bubbles can change, but there can be no changes in the information pattern itself because the bubbles cannot pass each other in the two paths. It is because of these facts that threatening blocking can be overcome by driving forward in the channel. A prior art shift register memory with descrete bubble positions which requires special attention and which is known and proposed, is a memory in which one information channel is present which consists of one path, bounded by regions (one on each side of the path) of increased magnetic field strength. These regions are created in the plate of magnetic materials by two elogate strips of a hard permanent magnetic material. The magnetic field caused by these strips is directed opposite to the magnetization of the bubbles present, with the result that the bubbles cannot exist in the region of increased magnetic field strength. Consequently, bubbles present in the channel cannot leave this channel. Due to the presence of the magnetic material strips, a bubble energy distribution exists which causes the magnetic bubbles in the path to be preferably present on the one or on the other side within the path. Along the inner walls of the path in this known memory there are positions at given distances from each other which have a bubble energy which is lower for bubbles than in the remainder of the path. This is realized by means of dots of soft-magnetic, not permanently magnetizable material. Therefore, bubbles will preferably be present on these defined positions. Bubbles on positions along the one inner side of the path have the binary 1-bit value, and bubbles on positions along the other inner side of the path have the binary 0-bit value. Furthermore, in this known proposal it is ensured that the distance between the preferred positions on both sides in the path is so large that two bubbles cannot be present adjacent to each other in the transverse direction of the path. A binary information pattern can thus also be present in this channel. In this known arrangement, the interaction forces between the bubbles in the channel ensure, as in the memory according to the invention, that an information pattern can be transferred in its entirety; however, the reliability at which this takes place in the known device is seriously limited by the its arrangement. This is because the preferred positions for the bubbles within the channel and, hence, the distances between the bubbles and hence also the force of their interaction are structurally defined. As a result, such a channel has a fixed defined storage capacity. In the shift register according to the invention, the capacity is not structurally laid down by bit locations, but is variable because in the case of a large input of information the bubbles can be pressed close together. Apart from the structurally simpler setup of the magnetic bubble shift register according to the invention, accompanied by the said advantage, the known prior art device has a further drawback in that during the jumping of the bubbles from one preferred position, to the next preferred position an intermediate situation arises during which the bubbles can be externally influenced so that they might jump from one inner side of the path to the other inner side of the path. This will occur particularly in curves in the channel and also if a plurality of zeros and ones are successively present in the channel. This is because the repulsive forces between the bubbles can influence the jumping direction during such a jump, hence making it uncertain where the jump will end. This situation cannot occur in the shift register memory according to the invention. A bubble will not leave its own path within the channel on account of the high energy threshold between the two paths in the channel. In addition to the complex construction (strips of hard permanent magnetic material and dots of soft, not permanently magnetizable material which are provided therebetween), the known device has a further drawback. Just as on the inner sides of the said path, regions of a comparatively low bubble energy will also be situated on the outer sides of the path, bounded by the strips of magnetic material. Bubbles will also be preferably situated therein. Bubbles which do not belong to the defined information flow can reside in these "outlying" regions, thus causing a serius disturbance of the transfer of information in the channel. The memory according to the invention does not have such "outlying" regions, so these regions cannot form an obstruction.

SUMMARY OF THE INVENTION

The information to be written into the magnetic bubble shift register memory according to the invention will generally be applied to the store in the form of an information flow with 0-bit and 1-bit values. The bubbles which originate from a bubble source, must then be applied to one or the other one of the two paths in accordance with the applied information pattern. This can of course be simply effected from two separate bubble sources, one for bubbles representing the 0-bit value and one for bubbles representing the 1-bit value. However, a memory according to the invention in which only one common bubble source is required is characterized in that the said two paths originate from a common path of lower bubble energy, the common path serving as a bubble supply for both of the two paths, means being provided in the vicinity of the change-over, referred to as a switch, from the common path to the two paths, to cause, under the control of the information to be written into the memory, the 0-bits in the form of bubbles to move to the one path and the 1-bits in the form of bubbles to move to the other path.

A further elaboration of this arrangement is characterized in that the part of a path which is covered by a bubble at the area of said switch, in the vicinity of and on the branching point of the common path to one of the two paths, is substantially the same, so that when the bubble passes the switch, the bubble energy remains substantially the same. Thus the bubble switch does not impede the bubble supply. For reading the information from the memory according to the invention, the memory is designed so that a first detector is arranged in the vicinity of the one path and a second detector is arranged in the vicinity of the other path for the detection of bubbles in the two paths.

A further embodiment of the magnetic bubble shift register memory according to the invention is characterized in that the ends of the said first and second paths which are remote from the location where they originate from a common path terminate into a common path which is again suitable as a bubble supply path. According to this arrangement, a closed system of paths is possible so that instead of one detector per path, only one bubble detector for detection of passing bubbles is provided by means of which the information can be read with the aid of a timing device.

If destruction of the bubbles at the end of their path is necessary or desired, reading out together with destruction can also be performed in a different manner. One embodiment of the magnetic bubble shift register memory according to the invention is therefore characterized in that said first and second paths terminate into each other at their ends through a curve, the shift register memory furthermore comprising first and second means by which bubbles can be detected and subsequently destroyed in the direction of the curve on a first and a second location; a bubble detected on the first location indicating a next bubble in the second path, and a bubble detected on the second location indicating a next bubble in the first path of said two paths. Adaptation problems on the basis of speed differences of the information transfer in two devices can thus be readily solved. The shift register according to the invention constitutes a flexible buffer.

A still further embodiment of a magnetic bubble shift register memory according to the invention is characterized in that a second plate of magnetic material having a preferred magnetization direction transverse to the first plate is provided, the said second plate comprising a third continuous bubble path in comparison with the vicinity thereof, of lower bubble energy, the said third path being situated, in projection, between the two paths in the first plate, it being possible for one or more bubbles to exist and hence be maintained in said third path as additional information and it being possible to transfer and maintain the latter bubbles in given locations in the pattern by interaction with bubbles in the first plate. Said additional information may be, for example, synchronization information or can serve, possibly even at the same time, for distinguishing information bit series which are successively stored in the memory from each other. This is advantageous, for example, if image information is stored in the form of image lines which are separated by spacing.

In the construction of an extensive magnetic bubble memory according to the invention, steps can be taken, in view of the occurrence of undesired interactions between bubbles in the various storage layers, to ensure that, if a plurality of first plates or a plurality of combinations of first and second plates are present, the paths in the first plates or the paths in the combinations of first plates and second plates are transverse to each other. A number of information channels can be present in a plate of magnetic material. A minimum distance between the channels must then be taken into account. The memory according to the invention has another advantage in comparison with the bubble memories with discrete positions. Some interaction between adjacent channels is permissible because the information pattern will not be disturbed thereby. In the case of memories wth discrete bit positions, an undesired interaction can have an immediate information disturbing effect.

There are various methods of realizing the said paths for information transfer and storage according to the invention. A known method of creating bubble paths, in comparison with the vicinity thereof, having lower bubble energy in a plate of magnetic material, is that strips of a soft-magnetic, not permanently magnetizable material such as permalloy are provided at some distance from the plate. The paths are then the projection of these strips on the plate. Another possibility is to form said bubble paths of lower bubble energy in a plate of magnetic material by means of a strip of permanently magnetizable material which is provided on the plate, the paths then being present on both sides of the projection of said strip. Another method is to form said bubble paths of lower bubble energy in a plate of magnetic material by subjecting the plate to a physical or chemical treatment.

The invention will be described in detail hereinafter with reference to the figures. It is to be noted that the examples shown are non-limitative, but represent merely a choice from a great many possibilities.

DESCRIPTION OF THE PREFERRED EMBODIMENTS

Figure 1:
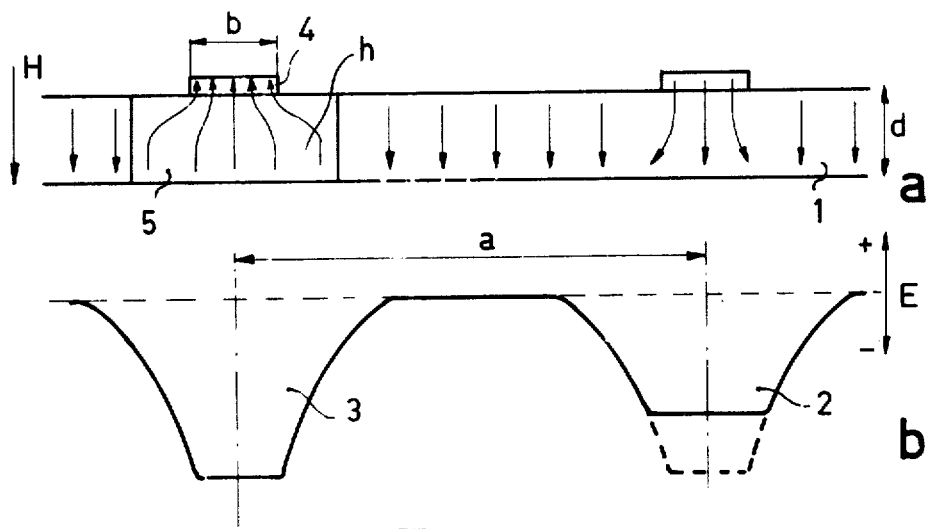
FIGS. 1a and 1b present a diagrammatic illustration in outlines of the principle of the magnetic bubble shift register memory of the invention.

FIGS. 1a and b illustrate the principle underlying the magnetic bubble shift register memory according to the invention. The reference 1 in FIG. 1a denotes a plate of magnetic material having a preferred magnetizatiion direction which is transverse to the plane of the plate. The plate 1 is situated in a magnetic field H so that the plate is also magnetized in this direction. Present in the plate 1 are domains 5, referred to hereinafter as bubbles, which have a generally circular section and which have a magnetization h which is opposed to H. The plate 1 comprises two separate bubble paths 2 and 3 (see FIG. 1b), each path having lower buble energy (E) in comparison with the vicinity. This means that a bubble 5 will preferably be situated in such a path 2 or 3. Such a path is clearly defined and is bounded by regions having a high bubble energy (E) for a bubble in comparison with the vicinity. As a result, once a bubble 5 is present in such a path it will not leave this path. In this example such a path 2 or 3 is created by means of elements 4 which are strips of soft-magnetic material which is not permanently magnetizable. Furthermore, the distance a between the center lines of the paths 2 and 3 is at least equal to the bubble diameter, so that a bubble will not simultaneously adhere to the paths 2 and 3. The maximum value of this distance is also limited because there must always be interaction between bubbles 5 in the two paths 2 and 3. In FIG. 1a and b one bubble 5 (at the left) is shown in path 3. As a result of its interaction force in the direction of path 2, that is the repulsive interaction with bubbles in path 2, the region of lowest bubble energy will be slightly increased in this path (dots). This means that as a result of said interaction a bubble 5 will peferably not be at that location of path 2. In other words, a bubble 5 which is situated in one path (3) prevents passage of a bubble 5 in the other path (2).

Figure 2:
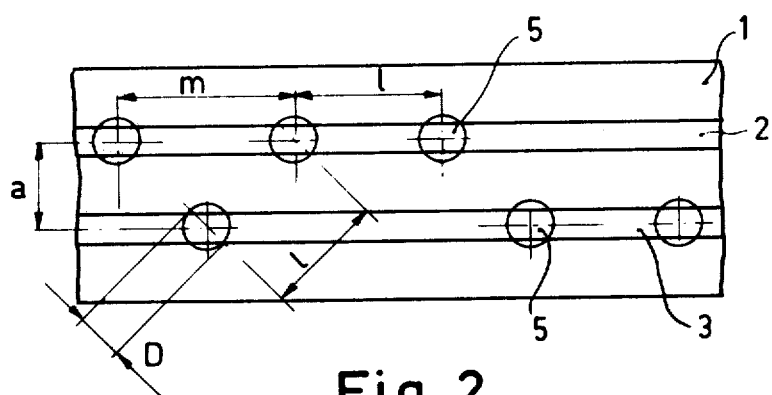
FIG. 2 shows a magnetic bubble shift register memory plate according to the invention.

FIG. 2 shows how this becomes manifest in the plane of a plate 1. A pattern of bubbles 5 which is distributed in a given sequence over the two paths 2 and 3 will always be maintained on the basis of the properties of the configuration. In the case of transfer, for example, as a result of the supply of new bubbles to the channel formed by the paths 2 and 3, the bubbles will be shifted forward according to the same pattern. In the case of a limited channel length, they will be pressed closer together, but they cannot pass each other so the pattern itself will be maintained. If material defects or stresses in the material hamper the displacement of one or more bubbles, the driving interaction between the bubbles of the pattern will overcome threatening blocking. All sorts of external circumstances will change the distances m and l between the bubbles, but the pattern will be maintained. Once a pattern has been introduced into the channel, it can be maintained therein for a prolonged period of time. The magnetic bubble shift register memory according to the invention utilizes the said properties of this configuration. Binary information can be stored and transferred in the paths 2 and 3. The 0-bits can be present in the form of bubbles in one path, for example 2, while the 1-bits can be present in the form of bubbles in the other path 3. A series of information bits is thus stored, in this example (FIG. 2) 010011.

The data presented here illustrate how an arrangement of the above kind can be realized in practice in experimental surroundings (FIGS. 1 and 2). A plate 1 of Yb (ytterbium) orthoferrite having a thickness $d=50$ $\mu m$ ($\mu m = 10^{-6} m$) contains bubbles having a diameter D of approximately 150 $\mu m$ ±50 $\mu m$, depending on the applied field H which has a strength of 50–70 Oersted. The width b of the, permalloy strips is 60 $\mu m$. The distance a between the strips (center-to-center distance) is 250 $\mu m$. The thickness of the strips is 1 $\mu m$. In the example of FIG. 2 the bubbles occupy the positions shown therein under the given circumstances, the distance 1 between the bubble centers being 400 $\mu m$, the distance m being 600 $\mu m$.

Figure 3:
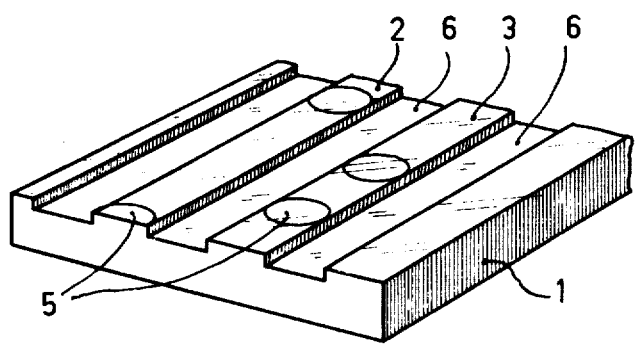
FIG. 3 shows a magnetic bubble shift register memory plate with local thinned portions.

FIG. 3 shows that the paths 2 and 3 can alternatively be realized in a different manner. The plate 1 is provided with locally thinned portions 6 (scratches in the plate) between which the relevant paths 2 and 3 are situated. Therein, bubbles 5 form an information pattern, as in FIG. 2, which can be transferred and maintained in its entirety in the longitudinal direction of the paths 2 and 3. In this figure a pattern 0110 is shown. The thinned portions 6 can be obtained, for example, by electrical, mechanical or chemical treatment of the plate 1. In principle it is also possible to make a path appear exactly at the area of such a treatment.

Figure 4:
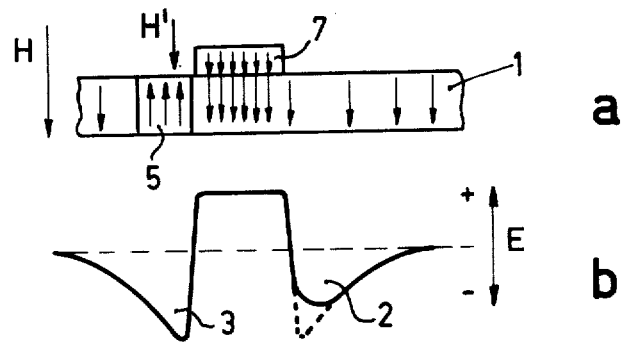
FIG. 4a and 4b present another diagrammatic outline of the principle of the invention.

FIGS. 4a and b show how the two paths 2 and 3 can also be produced by a single strip of hard-magnetic permanently magnetized material 7 which is provided on plate 1 and whose magnetization H' has the same direction as the field H. Again two individual paths of lower bubble energy in comparison with the vicinity are created. The strip 7 will exert an influence such that interaction between bubbles in the two paths remains, so that the passing of bubbles in the two paths is prevented. In all cases in which the exact location of the information in a memory is not important, the magnetic bubble shift register memory according to the invention can be used. Register memories for the storage of image information such as magnetic tape or magnetic disc memories can be replaced by the magnetic bubble shift register memory according to the invention. The advantages of the absence of mechanically moving parts are obvious. Moreover, as already stated, a compact set-up of the register memory according to the invention can be realized.

In the drawing sequence of FIGS. 5 to 8, corresponding elements are denoted by the same reference numbers. Only one information channel with two paths and the bubble projection therein is diagrammatically shown.

Figure 5:
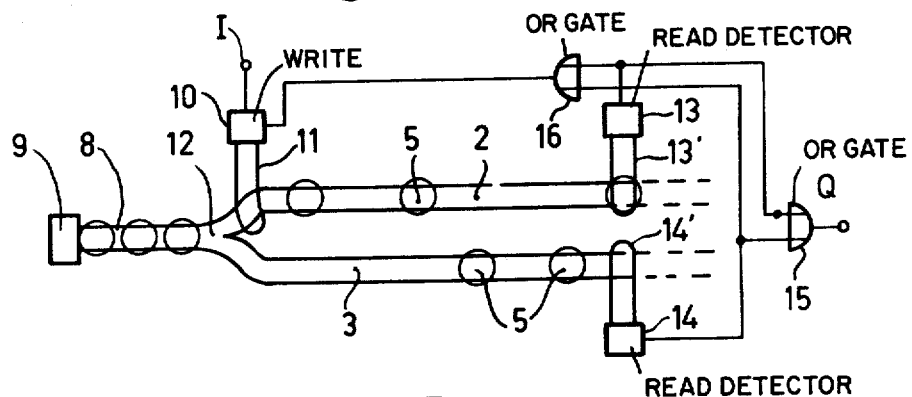
FIG. 5 shows an embodiment of the invention having a common bubble source for two paths.

FIG. 5 shows how the information can be written into and read from the magnetic bubble shift register memory according to the invention. Paths 2 and 3 originate from a common path 8, at the beginning of which a bubble source 9 is positioned. In this example, bubbles 5 are situated in the paths. The references 10 and 11 denote write means, while the references 13 and 14 denote read means. The branching point of path 8 into the paths 2 and 3 is denoted by 12. The references 15 and 16 denote OR-function gates. The operation is as follows: bubbles from source 9 are forced onto path 8. Arranged in the vicinity of the branching point of path 8 into paths 2 and 3 is an element 11, a wire loop, which is controlled by the write means 10 and by means of which it is ensured that a bubble will move from path 8 to path 2 or 3 in accordance with the bit information which is time-sequentially applied to input I of 10. This is effected by varying the current direction of the current through loop 11 in accordance with the applied information. In this example, a binary information pattern 01100 is thus written (from right to left). Reading out is effected by means of the read means, that is, a first and a second detector 13 and 14, respectively. These are the detectors which detect the bubbles passing on the paths 2 and 3 by means of wire loops 13' and 14', respectively. The signals generated thereby can be assembled again to form a time sequential information bit series by utilizing an OR-function gate 15. A signal supplied by 14 is applied directly to the output Q, and a signal supplied by 13 is applied, after inversion (denoted by the dot on the relevant input of 15), to this output Q. The said detectors 13, 14 can also consist of magneto-resistors, which are electric resistors which vary under the influence of a magnetic field (in this case of a bubble).

FIG. 5 also shows how, if desired, input and output bit signals can be synchronized. Each bubble detected in 13 or 14 supplies a pulse to the output of OR-function gate 16. These pulses are applied as synchronization pulses to the source 9 and the write means 10 and 11. Each pulse from gate 16 releases the path for the writing of a next bit. After the information has been read out as described above, the information can proceed further through the magnetic bubble shift register memory or be destroyed after detection in loops 13' and 14'.

Figure 6:
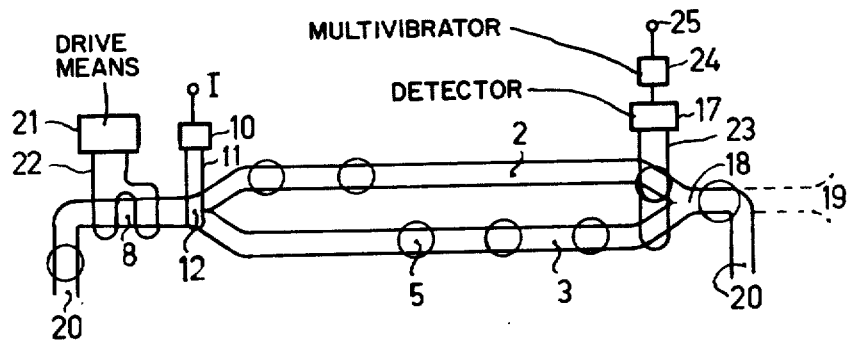
FIG. 6 shows a further embodiment of the invention having a common termination path.

FIG. 6 shows that the destruction and continuous supply of new bubbles is not necessary in the case of a suitable arrangement. In such an arrangement, the paths 2 and 3 are combined to form a path 18 behind a bubble detector 17. The path 18 can again serve as a supply path (like path 8) for a next path structure, such as 19, or it can return, by a connection across path 20 (not fully shown), to path 8. The bubbles 5 are thus used again. The forward driving in such a closed system can be effected by a known drive means 21, 22. In this case, 21 denotes a electric alternating current source which supplies alternating current to a conductor 22 which is meandered at the area of path 8. This alternating current produces an alternating attraction and repulsion force along the meander, with the result that a bubble is displaced, in this case from left to right as a result of the slight widening to the right of the path 8. The frequency of said alternating current determines the flow rate of the bubbles in the closed system. At a given drive frequency, the transfer speed of a bubble pattern in such a closed system is constant. This can be utilized for the detection of the pattern. Only one detector 17, comprising a wire loop 23 which is arranged across both paths, is then required. The pattern passes the detector at a constant speed and from the difference in distance (measured along the paths) between two bubbles on the same path and two bubbles on a different path it can be derived whether 1-bits or 0-bits pass. This is because the time lapse between the passage of two successive bubbles is dependent on whether or not a switch of path took place. For the purpose of illustration, compare the example of FIG. 2. Two successive bubbles in path 3 have a different distance than two successive bubbles which proceed in path 3 and path 2, respectively. In order to enable determination of this time difference, the pulses which are produced by a bubble in detector 17 can be utilized for switching over a timing device, such as a multivibrator 24, with the result that a series of pulses of varying width appears on an output 25 thereof. A wide pulse indicates bits of the same type (1 or 0) and a narrow pulse indicates a transition 0 → 1 or 1 → 0, depending on whether previously 0 or 1 bits were present. For example, if the first bit of a series is laid down (for example, a 1), the whole series is thus unambiguously determined.

Figure 7:
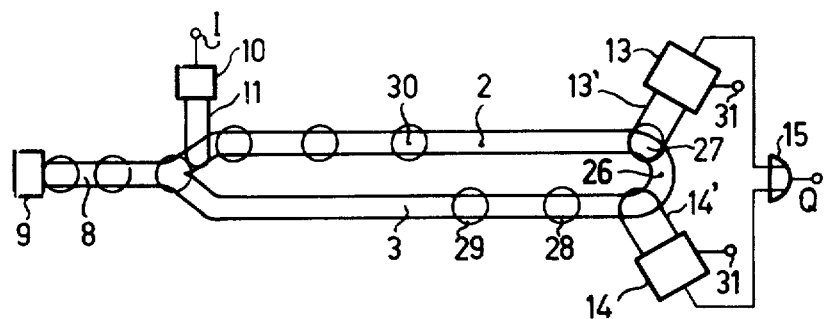
FIG. 7 shows another embodiment of the invention terminating in a curved path.

FIG. 7 shows another arrangement wherein source 9 supplies bubbles to path 8. In loops 13' and 14', and their detectors 13 and 14, respectively, bubbles are again detected and applied to output Q (see FIG. 5) through gate 15. (The detection can again be effected by means of magneto-resistors). After detection, the domains are destroyed by applying a current to the loops, in this case, the same loops 13' and 14'; the current destroying a relevant domain. The current is applied through terminals 31 to 13 and 14. The special aspect of this arrangement is that the ends of the paths 2 and 3 terminate in a curved path 26. The read procedure is then as follows: a domain in path 2 or 3 which arrives at the curve 26 will occupy a location underneath loop 13' or 14', depending on where, measured along path, a next bubble is present in the paths 2 and 3. For example, bubble 26 is underneath loop 13' because the next bubble 28 which is on path 3 drives the relevant bubble to this location by its repulsive force. Consequently, a bubble 27 detected in 13' or 13 indicates a next 1 -bit (bubbles in path 3 are defined as 1 bits as above). If the current which was applied, after detection, from terminal 20 to loop 13' has destroyed bubble 27, bubble 28 (and the entire further pattern) is advanced. Bubble 28 will then be situated underneath loop 13'. This is because domain 29, being the next bubble, is situated on path 3 and shifts the bubble 28 to loop 13'. Consequently, the bubble 28 detected in 13' indicates that the next bubble 29 also represents a 1-bit. When bubble 28 has been destroyed, bubble 29 will arrive underneath the loop 14' because due to the repulsive action of the bubble 30, this is the location of the lowest bubble energy for bubble 29. Bubble 29 is therefore detected in detector 14, thus indicating that the next bubble 30 represents a 0-bit. In this manner, the next bit is denoted by the location (13' or 14') at which the preceding bubble is detected.

One major advantage of this set-up must be separately stated. The destruction of bubbles underneath the loops 13' or 14' can be effected at instants which are externally determined. The rhythm of the current supply to terminals 31 of 13 and 14 is then determined by the speed at which the detected information can be taken up in a device for taking up this information. This is independent of the speed at which the information is applied to the magnetic bubble shift register memory. As a result of the absence of fixed bit positions in this memory, a large degree of independence exists with respect to writing and reading.

In the described embodiments of magnetic bubble shift registers according to the invention it is possible, particularly in the case of long channels, to transfer written information as far as possible to the end of the channel at regular frequencies. This can be readily realized by applying a driving magnetic field across the plate of magnetic material, the written information thus being driven to the right (on the drawing). Space is thus vacated at the write side for new information. Fast writing into and a good fill rate of such a channel are thus ensured.

Figure 8:
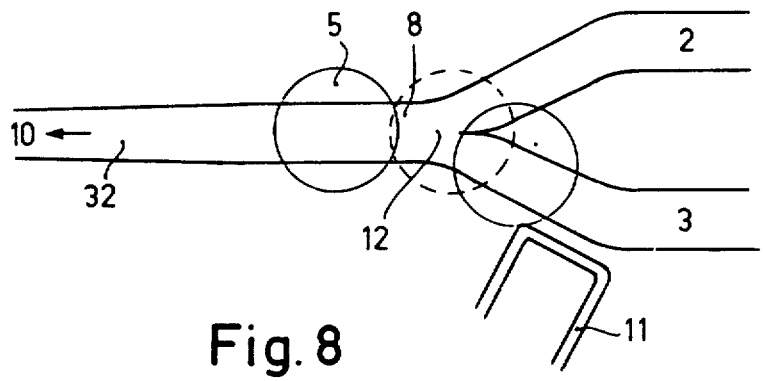
FIG. 8 shows details of the embodiments of FIGS. 5 through 7.

Fig. 8 shows a further detail of the path configuration of the preceding FIGS. 5 to 7. This detail concerns the branching point 12 (switch) where the common path 8 is divided into the paths 2 and 3. The part of a path or paths covered by a bubble 5 at the area of the switch and in the vicinity thereof is substantially the same. The differences in the bubble energy at different locations of the switch are therefore small for a passing bubble, with the result that the switch as such does not hamper the bubble transfer. Arranged near the switch 12 is the loop 11 which ensures that the bubbles (supplied from the left) are distributed over the paths 2 and 3 in the correct pattern. It is alternatively possible to widen the paths 2 and 3 slightly immediately after the switch 12, so that an additional bubble energy drop to the right occurs, with the result that a bubble is pulled onto the relevant path by an additional force to the right.

FIG. 8 also shows a part 32 of the common path 8 which increases from narrow to wide. A bubble energy drop to the right then exists, with the result that bubbles 5 are pulled from a source (10) to the switch 12 by an additional force.

Figure 9:
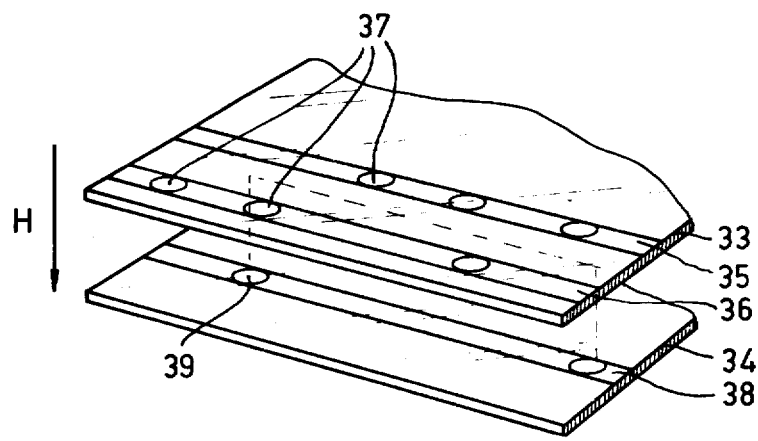
FIG. 9 shows an embodiment with two parallel plates of magnetic material.

FIG. 9 shows an embodiment of the magnetic bubble shift register memory according to the invention, comprising two plates 33 and 34 of magnetic material as described above. The preferred magnetization direction is assumed to be directed downwards in both plates (H). Plate 33 comprises two paths 35 and 36 in which an information pattern consisting of domains 37 is present and transferrable (compare further the description given with reference to the FIGS. 5 to 8). In plate 34 which covers, at least in projection, a part of plate 33, a path 38 is provided which, projected onto plate 33, is situated centrally between the paths 35 and 36. Considering also what is described in a previously filed application (Netherlands Patent Application 7110674, and corresponding U.S. Pat. No. 3,944,842) in the name of Applicant concerning the interaction forces occurring between domains in plates which are arranged at a short distance one above the other, it will be obvious that in this case an interaction occurs between bubbles 37 in plate 33 and bubbles 39 in plate 34.

This arrangement can be used as follows: a bubble 39 in path 38 of plate 34 is taken along by said interaction with the movement of the pattern of the information in plate 33, while retaining its position within said pattern. This can be used to good advantage in all cases where a structure, such as different information words or lines, is to be laid down or maintained in the information pattern by way of "interpunction". For example, after each information word, consisting of a number of bits, additional information can be transported in the form of said bubble 39 in path 38, the latter bubble indicating, upon detection at the end of its path, the end of an information word originating from the paths 35 and 36.

What is claimed is:

1. A magnetic bubble shift register comprising:
   first and a second plate of magnetic material spaced apart from one another;
   each plate capable of maintaining and moving magnetic bubbles;
   a channel in each of said plates for transport of information and for storage of information by said bubbles; and
   means for controlling the bubble energy levels in each of said channels comprising:
   an intermediate elongated region within said magnetic material;
   said region having a height different from the height of said channels.

2. A magnetic shift register as defined in claim 1, wherein each of said channels comprises two separate elongated generally parallel extending continuous paths.

3. A magnetic bubble shift register as defined in claim 2, wherein said means for controlling the bubble energy levels provides a higher bubble energy outside each of said paths, so that bubbles in said paths are prevented from leaving their respective paths.

4. A magnetic bubble shift register as defined in claim 2, wherein the distance between the center lines of said paths is no smaller than the diameter of said bubbles, and the interaction between respective bubbles in said two paths prevents a bubble situated in one of said paths from moving past a bubble situated in the other of said paths.

5. A magnetic bubble shift register as defined in claim 2, wherein said paths comprise strips of magnetic material.

6. A magnetic bubble shift register as defined in claim 5, wherein said magnetic material comprises permalloy.

7. A magnetic bubble shift register as defined in claim 5, wherein said stripes are located on said plates.

8. A magnetic bubble shift register as defined in claim 5, wherein said magnetic material comprises a hard permanent magnetic material.

9. A magnetic bubble shift register comprising:
   a first plate of magnetic material capable of maintaining and moving magnetic bubbles;
   a channel for transport of information and for storage of information and continuous positions thereon by said bubbles;
   said channel comprising:
   a single bubble supply path for supplying said bubbles at a switching point; and
   first and second parallel paths extending from said bubble supply path at said switching point;
   means for switching said bubbles from said bubble supply path to said first or said second parallel extending path; and
   a second plate of magnetic material capable of maintaining and moving magnetic bubbles and having a preferred magnetization direction which is transverse to said first plate;
   said second plate comprising:
   at least a continuous third path having lower bubble energy in comparison with the vicinity thereof;
   said third path being situated in projection between said first and said second paths in said first plate;
   said third path enabling one or more bubbles to be transported therein for providing additional information;
   said latter bubbles being transported or maintained in given locations on said third path by interacting with bubbles in said first plate.

10. A magnetic bubble shift register as defined in claim 9, wherein the bubble energy of a bubble is substantially the same in said bubble supply path, said first path, said second path and said third path on said second plate.

11. A magnetic bubble shift register as defined in claim 9, further comprising:
    means for reading information from said channels, including a first detector disposed in the vicinity of said first path and a second detector disposed in the vicinity of said second path for the detection of bubbles in said respective first and second paths.

12. A magnetic bubble shift register as defined in claim 9, further comprising:
    a bubble detector for detection of the bubbles moving along said first and said second paths; and
    a timing device for synchronizing the detection of said bubbles.

13. A magnetic bubble shift register as defined in claim 9, wherein said first and said second paths merge into each other at the ends of said first and second paths;
    said shift register further comprising:
    first and second means for detecting and subsequently destroying bubbles at a predetermined first and a predetermined second location on said first and said second paths respectively.

14. A magnetic bubble shift register as defined in claim 13, wherein a bubble detected at said first predetermined location on said first path indicates a next bubble in the said second path, and a bubble detected in said second predetermined location on said second path indicates a next bubble in said first path.

15. A magnetic shift register as claimed in claim 13, wherein the time of the destruction of the bubbles by said first and second means for detecting and subsequently destroying bubbles is determined independently of the rate at which the information to be transported or stored in said channel is supplied thereto.

16. A magnetic bubble shift register memory comprising:
    a plate of magnetic material capable of maintaining and moving magnetic bubbles;
    bubble supply means;
    a channel on said plate for the transfer of information by said bubbles and for storage of information at arbitrary points therein by said bubbles;
    means for controlling the bubble energy levels in said channel;
    the distance between said storage points being arbitrary and determined by said bubbles in said channel;
    said channel comprising first and second separate substantially parallel-extending continuous paths on said plate;
    each of said paths having a lower bubble potential energy in the vicinity of each of said paths for preventing bubbles in said paths from leaving said paths;
    a spacing between said first and second paths, having a width such that the interaction between adjacent bubbles in said respect first and second paths prevents a bubble situated in one of said paths from moving past a bubble situated in the other of said paths;

said spacing between said first and second paths having a higher bubble energy than each of said paths;

the presence of a bubble at an arbitrary position along said first path representing a binary 1--bit, and the presence of a bubble at a arbitrary position along said second path representing a binary 0-bit;

said first and second paths spaced apart from one another such that the distance between the center lines of said paths is greater than or equal to the diameter of said bubbles;

the interaction between said bubbles and said two paths preventing a bubble situated in one path from passing a bubble situated in the other path being such that the binary information contained in sequence of bubbles in both of said paths can be unambigously transferred in said channel in the direction of said channel and can be maintained both during transfer and in a rest state.

17. A magnetic bubble shift register memory as claimed in claim 16 further comprising a common path having lower bubble energy than adjacent areas;

said common path bifurcating into said first and said second paths at a bifurcation region on said plate;

said common path serving as a bubble supply for said two paths;

coding means being provided in the vicinity of said bifurcation region for selectively switching bubbles from said common path to one of said first and second paths such that the 0-bits in the form of bubbles move to one path and the 1-bits in the form of bubbles move to the other path under the control of the information to be written into said memory;

such that the part of a path which is covered by a bubble at the area of said bifurcation region in the vicinity of and on the branching point of the common path to one of said two paths, has substantially the same bubble energy as on each of said paths, so that the bubble energy remains substantially the same when it passes said bifurcation region.

18. A magnetic bubble shift register memory as defined in claim 16 further comprising:

means for reading stored information from said shift register, comprising:

a first detector arranged adjacent said first path and a second detector arranged adjacent said second path transversed from said first detector, for the detection of the presence of bubbles in said respective first and second paths.

19. A magnetic bubble shift register memory as defined in claim 16, further comprising:

a common terminal path into which said first and second paths converge at a location remote from said bubble supply common path;

the ends of said first and second paths remote from said common path where they originiate terminating into said common terminal path, said common terminal path being further suitable as a bubble supply path.

20. A magnetic bubble shift register memory as defined in claim 6 wherein the bubble energy of a bubble is substantially the same in said bubble supply path, said first path and said second path.

21. A magnetic bubble shift register memory as defined in claim 16, further comprising:

a closed system of paths;

a bubble detector for the detection of bubbles passing in said two paths;

a timing device for synchronizing the detection of said bubbles.

22. A magnetic bubble shift register as defined in claim 16 further comprising:

said first and second paths merging into each other at their ends by way of a curve;

first and second means for the detection and subsequent destruction of bubbles at a predetermined first and a predetermined second location on said first and second paths respectively;

a bubble detector at said first location indicating a next bubble in said second path; and a bubble detector in said second location indicating a next bubble in said first path;

means for determining the instants of destruction of said bubbles in said first and second detection means, said means being a function of the speed at which said information can be transferred to a further device, said transfer being independent of the speed at which said information is supplied to said shift register memory.

* * * * *